United States Patent
Katagiri et al.

(10) Patent No.: US 7,002,158 B2
(45) Date of Patent: Feb. 21, 2006

(54) SOLID-STATE RADIATION DETECTOR USING A SINGLE CRYSTAL OF COMPOUND SEMICONDUCTOR INSB

(75) Inventors: Masaki Katagiri, Ibaraki (JP); Tatsuya Nakamura, Ibaraki (JP); Ikuo Kanno, Kyoto (JP); Osamu Sugiura, Tokyo (JP)

(73) Assignee: Japan Atomic Energy Research Institute, Chiba-ken (JP)

( * ) Notice: Subject to any disclaimer, the term of this patent is extended or adjusted under 35 U.S.C. 154(b) by 0 days.

(21) Appl. No.: 10/764,574

(22) Filed: Jan. 27, 2004

(65) Prior Publication Data

US 2004/0182993 A1    Sep. 23, 2004

(30) Foreign Application Priority Data

Jan. 27, 2003    (JP) .............................. 2003-017310

(51) Int. Cl.
*G01T 1/24* (2006.01)
*H01L 27/14* (2006.01)
*H01L 31/00* (2006.01)
*H01L 31/06* (2006.01)

(52) U.S. Cl. .................... 250/370.12; 250/370.14; 257/428; 257/461

(58) Field of Classification Search ......... 250/370.01, 250/370.02, 370.05, 370.12, 370.14, 390.01, 250/214 R, 214.1
See application file for complete search history.

(56) References Cited

U.S. PATENT DOCUMENTS 3,723,831 A * 3/1973 Rogers ....................... 257/441
4,696,094 A * 9/1987 Yves et al. ..................... 438/93

OTHER PUBLICATIONS

Okamoto, A. and Shibasaki, I. "Transportation Phenomena of Sn-doped InSb Thin Films and Application to Hall Elements", International Conference on Molecular Beam Epitaxy (Sep. 15-20, 2002), pp. 219-220.*

Wm.C. McHarris, "InSb as a γ-Ray Detector", Nuclear Instruments and Methods in Physics Research A242 (1986) pp. 373-375.

Ikuo Kanno, et al., "Cryogenic InSb detector for radiation measurements", Review of Scientific Instruments, vol. 73, No. 7, Jul. 2002, pp. 2533-2536.

* cited by examiner

*Primary Examiner*—David Porta
*Assistant Examiner*—Frederick F. Rosenberger
(74) *Attorney, Agent, or Firm*—Banner & Witcoff, Ltd.

(57) ABSTRACT

A high-purity InSb single crystal not artificially doped with impurities is used as a radiation detecting medium. In order to obtain diode characteristics, a Au.Pd alloy is used to form a surface barrier layer. At 4.2 K, the device resistance of the thus fabricated solid-state radiation detector was as large as 1.4 kΩ and the rise time of output signals from a charge-sensitive preamplifier was as short as 0.4 μs, indicating reduced trapping of electrons or positive holes. The detector was also capable of measuring α-ray spectra over the temperature range from 2 K to 50 K.

3 Claims, 7 Drawing Sheets

PRIOR ART

SOLID-STATE RADIATION DETECTOR USING A SINGLE CRYSTAL OF COMPOUND SEMICONDUCTOR INSB

This application is based upon and claims the benefit of priority from Japanese Patent Application No. 173 10/2003 filed Jan. 27, 2003, the entire contents of this application are incorporated herein by reference.

BACKGROUND OF THE INVENTION

This invention relates to a solid-state radiation detector, particularly to one characterized by using a single crystal of the compound semiconductor InSb. InSb has the smallest band-gap energy of all the compound semiconductors known today and can create the greatest number of electron-hole pairs within the bulk upon irradiation, thus exhibiting better energy resolving characteristics than the conventional solid-state radiation detectors. Hence, InSb is used as an x-ray detector of high energy resolution in fluorescence x-ray analysis or in x-ray spectrometry at synchrotron radiation facilities. In addition, both In and Sb have higher atomic numbers than Ge which has heretofore been employed as gamma-ray detector, so InSb can be used as a gamma-ray detector for gamma-ray spectrometer having high detection efficiency and high energy resolution.

The Si(Li) or Ge detector featuring comparatively high band-gap energy has heretofore been employed as a solid-state x-ray detector with high energy resolution and the limit of energy resolution is about 120 eV in the case of measuring 6 keV x-rays.

Wm. C. McHarris pointed out in 1986 that the band-gap energy of the compound semiconductor InSb was so small (0.165 eV) that it had the potential to be used as a radiation detector [see Wm. C. McHarris, Nucl. Instrum. Methods Phys. Res. A242, 373 (1986)]. Although an InSb based infrared detector was later developed, it was not until recently that a radiation detector using the compound semiconductor InSb has been actually developed.

Kanno et al. recently fabricated a semiconductor device of the construction shown in FIG. 11 by forming a Mo surface barrier layer on top of a Ge-doped p-type InSb single crystal in order to provide it with diode characteristics. Kanno et al. also reported that the device could be operated at 4.2 K or lower temperatures in order to detect α-rays [see Kanno et al., Review of Scientific Instruments, Vol. 73, No. 7, 2533 (2002)].

SUMMARY OF THE INVENTION

An object of the present invention is to fabricate a solid-state radiation detector using an InSb single crystal that can generate more electron-hole pairs to produce a greater signal output than the conventional solid-state radiation detectors, ie., Si detector, Si(Li) detector and Ge detector. The InSb single crystal which can generate more electron-hole pairs is eventually capable of further improvement in energy resolution.

The conventional solid-state radiation detector fabricated by forming the Mo surface barrier layer on top of the p-type InSb single crystal has large leakage current and can only be operated at 4.2 K and below. It is therefore another object of the invention to fabricate a solid-state radiation detector using an InSb single crystal that can be operated at 10 K and higher temperatures. Since the detector is operable at 10 K and above, it can be easily cooled with a closed-cycle He freezer as electrical means. Further, if the detector is adapted to be operable at 77 K and above, it can be fabricated as an inexpensive solid-state detector that can be cooled with liquid nitrogen.

Speaking of the Si, Si(Li) and Ge detectors, both Si and Ge have small atomic numbers, so large crystals must be employed in order to use them as gamma-ray detectors. It is therefore still another object of the invention to fabricate a solid-state radiation detector using elements of high atomic numbers that can provide higher detection sensitivity even if they form only a small crystal.

DESCRIPTION OF THE PREFERRED EMBODIMENTS

The compound semiconductor InSb has a band-gap energy of 0.165 eV which is less than about a sixth of the band-gap energy of Si (1.1 eV) and less than about a third of the band-gap energy of Ge (0.67 eV). Therefore, when used to detect radiation of the same energy, InSb will generate six times as many electron-hole pairs as are generated by Si and the statistical error is about 2.4 times smaller. In other words, when 6 keV x-rays are to be measured, the highest energy resolution that can be achieved by the conventional solid-state detectors such as Si and Ge detectors is about 120 eV whereas a solid-state detector fabricated from InSb is anticipated to exhibit an improved energy resolution of about 60 eV.

In order to make a solid-state radiation detector that suffers smaller leakage current and which is operable at 4.2 K and above, a high-purity InSb single crystal is employed without being doped with impurities. If a Ge-doped p-type InSb single crystal is to be employed, a pn junction is formed in order to reduce leakage current so that the detector is operable at 10 K and above.

Since In and Sb have high atomic numbers of 49 and 51, respectively, using the compound semiconductor InSb is advantageous for the purpose of absorbing x-rays and gamma-rays and contributes to the fabrication of a smaller-scale solid-state radiation detector. If the probability of interaction with photons is expressed by (atomic number)$^5$ ×(density), the value for InSb is about 1400 times as high as the value of Si and about 10 times higher than the value for Ge. It follows that a Ge detector with a volume of 100 cc has an equivalent detection efficiency to an InSb detector with a volume of 10 cc.

The following examples are provided for further illustrating the present invention but are in no way to be taken as limiting.

EXAMPLE 1

Figure 1:
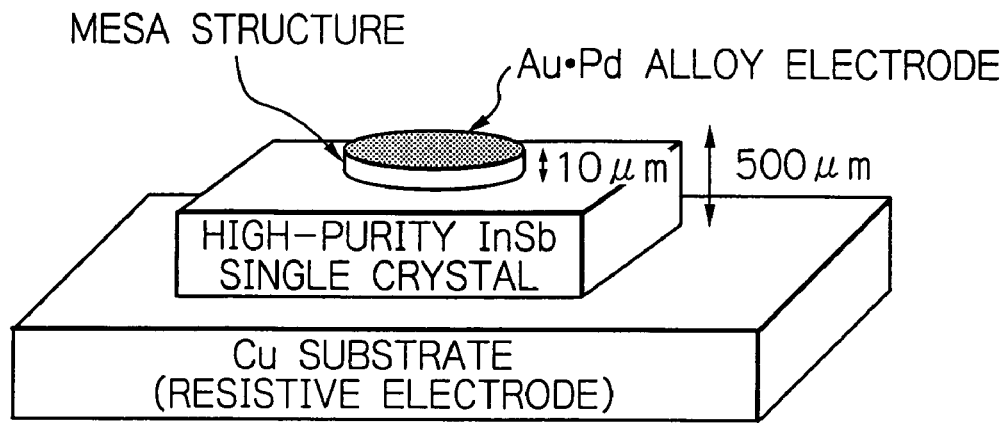
FIG. 1 is a schematic drawing of a surface-barrier type solid-state radiation detector using a high-purity InSb single crystal not artificially doped with impurities.

An example of the solid-state detector of the present invention is described as Example 1 with reference to FIG. 1. This detector is characterized in that a high-purity InSb single crystal not artificially doped with impurities is used as a radiation detecting medium and that a surface-barrier type electrode is formed on top of the medium in order to provide it with diode characteristics.

In Example 1, a high-purity InSb single-crystal wafer measuring 5 mm×8 mm in a thickness of 0.5 mm (manufactured by Sumitomo Electric Industries, Ltd.) was used as the InSb single crystal. The surface of the high-purity InSb single-crystal wafer was etched with a 1:10 liquid mixture of nitric acid and lactic acid and a Au.Pd alloy layer was then deposited in a thickness of about 4 nm. The alloy layer was subsequently etched to form a mesa electrode of 3 mmφ. In order to form a resistive electrode on the other side of the wafer, it was fixed by In soldering to a Cu substrate.

Figure 2:
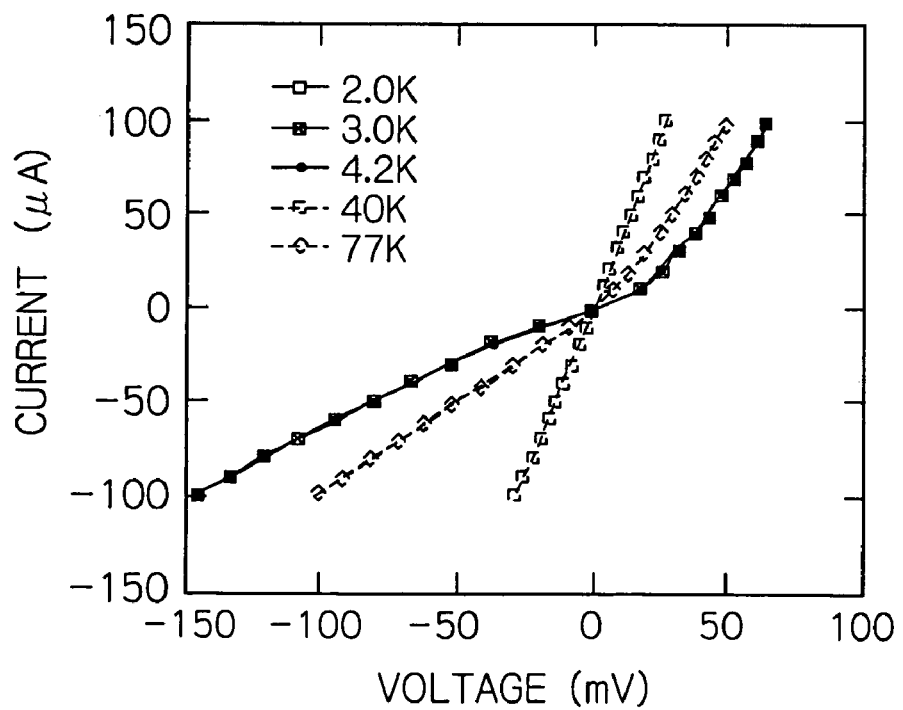
FIG. 2 is a graph showing the current-voltage characteristics of the surface-barrier type solid-state radiation detector for temperatures of 2 K, 3 K, 4.2 K, 40K and 77K.

In order to confirm that the fabricated InSb solid-state device would have diode characteristics, its current-voltage characteristics were measured at temperatures of 2 K, 3 K, 4.2 K, 40 K and 77 K. The results of the measurement are shown in FIG. 2. Almost identical diode characteristics were obtained at 2 K, 3 K and 4.2 K; diode characteristics were also obtained at 40 K; however, at 77 K, the current-voltage characteristics were substantially linear, almost approaching resistive characteristics. Since the device's resistance was 1.4 kΩ, the diode characteristics of the device at 4.2 K were found to have been improved by at least one order of magnitude over those of the prior art device that Kanno et al. fabricated by forming a surface barrier layer on top of p-type InSb.

Figure 3:
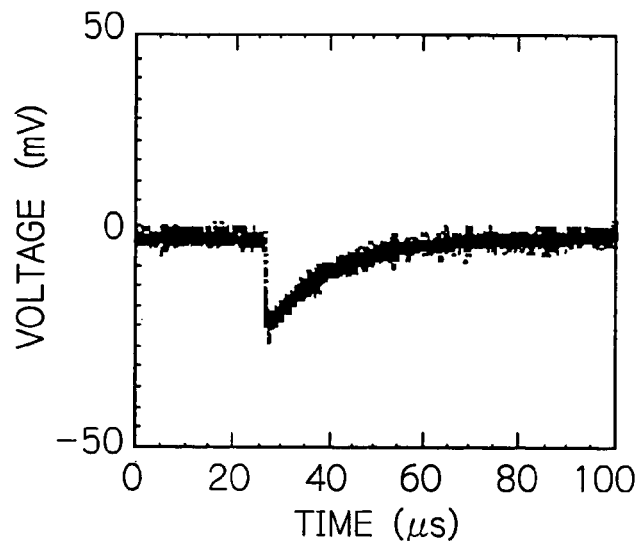
FIG. 3 is a graph showing the result of measuring the rise time characteristics of the detector at a temperature of 4.2 K.

Subsequently, the InSb semiconductor device was mounted on a liquid He cooling vessel and operated over a temperature range from 2 K to 50 K in order to measure its α-ray detecting characteristics. The rise time of output signals from a charge-sensitive preamplifier is a parameter that influences the performance of semiconductor devices and it was measured with a digital oscilloscope. The results of measurements at 4.2 K are shown in FIG. 3, from which it can be confirmed that even at 4.2 K, charge collection was possible within a period as short as 0.4 μs. Considering that the device that Kanno et al. fabricated by forming a surface barrier layer on top of p-type InSb had a rise time of 7 μs, the value obtained from the device of Example 1 was improved by at least one order of magnitude. It was also confirmed that the rise time did not change much at temperatures higher than 4.2 K.

The above results show that the electrons and positive holes produced in the bulk of high-purity InSb upon incidence of radiation were not trapped significantly but were collected at the n-type and p-type electrodes, respectively. Such reduced loss is a major factor in improvement of energy resolution.

Figure 4:
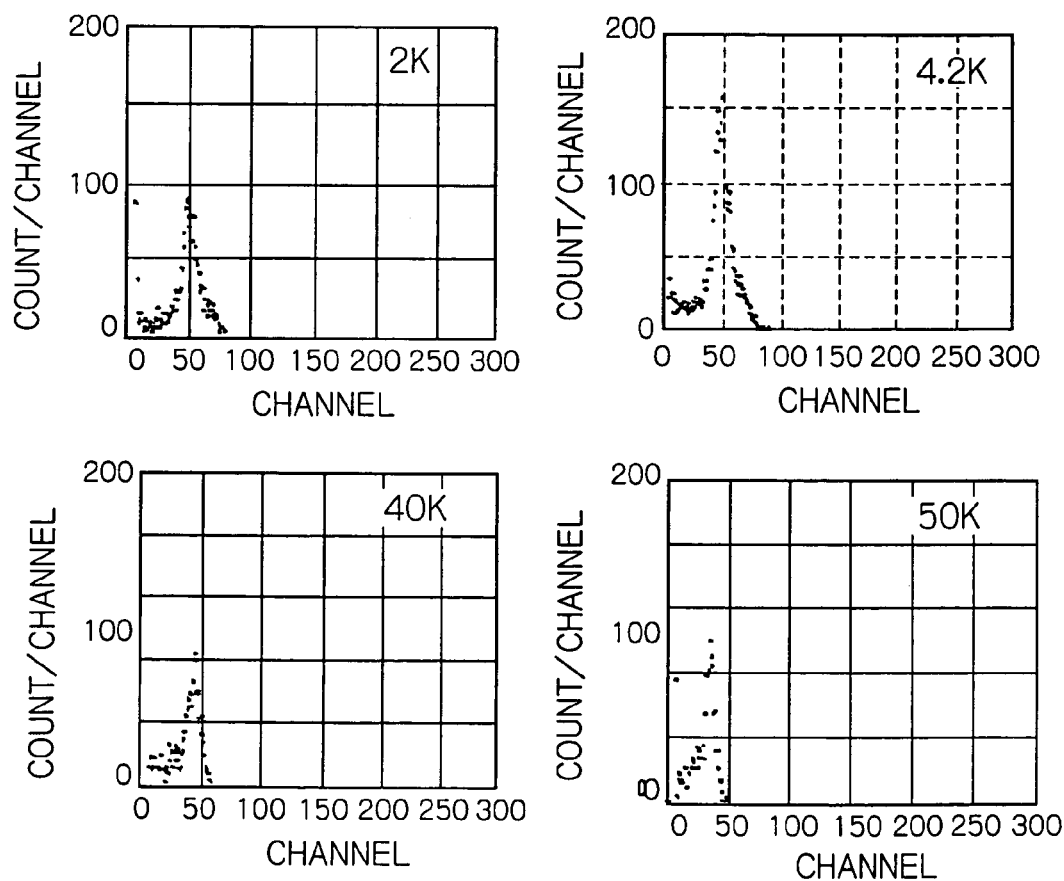
FIG. 4 is a set of graphs showing the results of measuring α-ray pulse height spectra with the detector over a temperature range from 2 K to 50 K.

The output signals from the charge-sensitive preamplifier were shaped and amplified with a main amplifier; thereafter, pulse height spectra were measured with a multi-channel pulse height analyzer. The results of measurements of α-ray pulse height spectra over a temperature range from 2 K to 50 K are shown in FIG. 4. A sharp α-ray peak was observed at each of the temperatures under test.

As a result, the high-purity InSb semiconductor device having the surface barrier layer formed on top of it was found to be capable of α-ray detection with reduced loss in charge collection over the temperature range from 2 K to 50 K.

EXAMPLE 2

Figure 5:
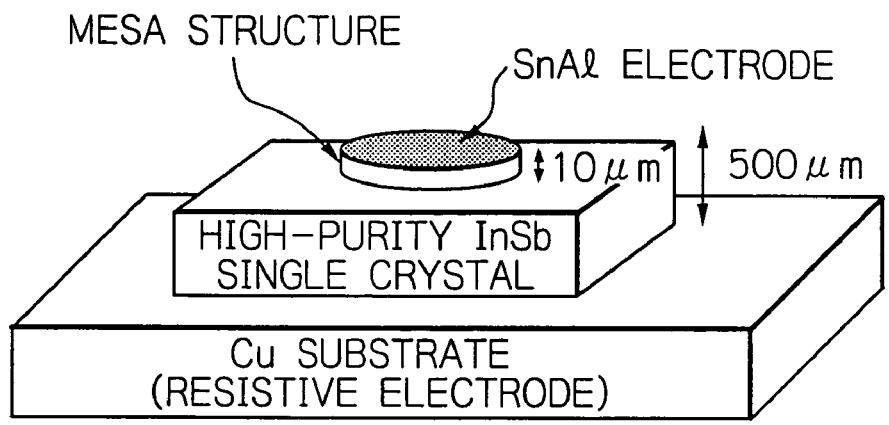
FIG. 5 is a schematic drawing of a pn junction type solid-state radiation detector using a high-purity InSb single crystal not artificially doped with impurities.

An example of the solid-state detector of the present invention is described as Example 2 with reference to FIG. 5. This detector is characterized in that a high-purity InSb single crystal not artificially doped with impurities is used as a radiation detecting medium and that a pn junction is formed in the medium in order to provide it with diode characteristics.

In Example 2, a high-purity InSb single-crystal wafer measuring 5 mm×8 mm in a thickness of 0.5 mm (manufactured by Sumitomo Electric Industries, Ltd.) was used as the InSb single crystal. The surface of the high-purity InSb single-crystal wafer was etched with a 1:10 liquid mixture of nitric acid and lactic acid and a Sn layer was then deposited. The SnA1 layer was subsequently etched to form a mesa electrode of 3 mmφ. In order to form a resistive electrode on the other side of the wafer, it was fixed by In soldering to a Cu substrate.

Figure 6:
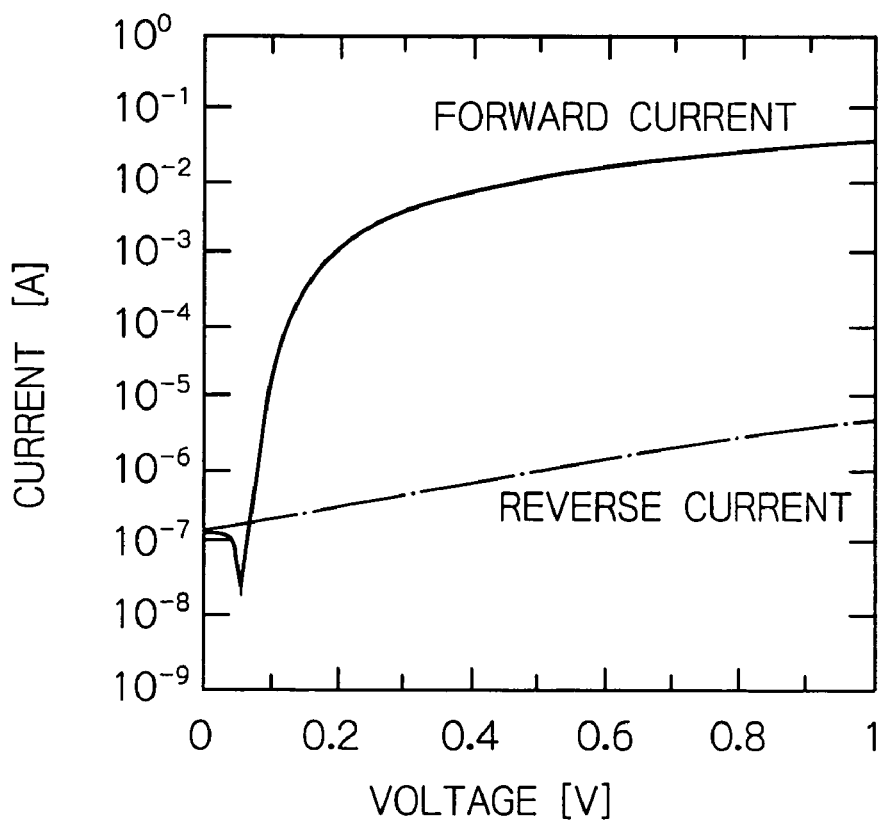
FIG. 6 is a graph showing the current-voltage characteristics of the pn-junction type solid-state radiation detector for a temperature of 77K.

In order to confirm that the fabricated InSb semiconductor device would have diode characteristics, its current-voltage characteristics were measured at a temperature of 77 K. The result of the measurement is shown in FIG. 6. Since the device's resistance was 140 kΩ, the diode characteristics of the device at 77 K were found to have been improved by at least three orders of magnitude over those of the prior art device that Kanno et al. fabricated by forming a surface barrier layer on top of p-type InSb. Those diode characteristics indicate that the high-purity InSb semiconductor device having the pn junction formed in it are capable of detecting radiation over the temperature range from 2 K to 115 K.

EXAMPLE 3

Figure 7:
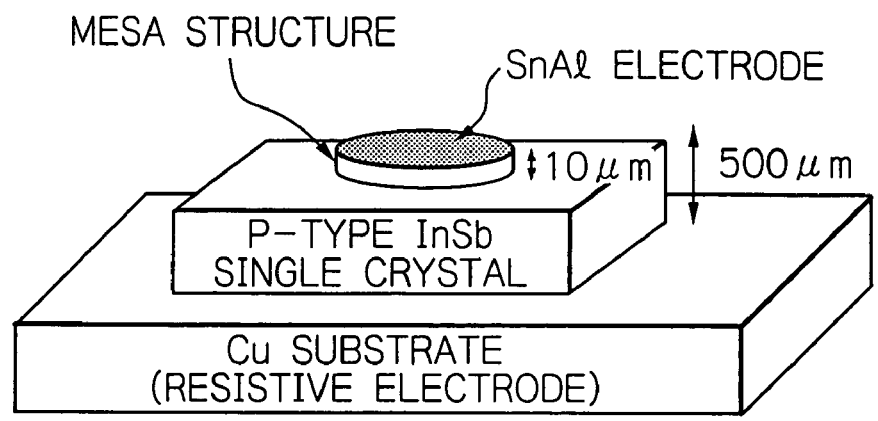
FIG. 7 is a schematic drawing of a pn-junction type solid-state radiation detector using a p-type high-purity InSb single crystal doped with Ge.

An example of the solid-state detector of the present invention is described as Example 3 with reference to FIG. 7. This detector is characterized in that a p-type InSb single crystal prepared by doping an InSb single crystal with Ge is used as a radiation detecting medium and that a pn junction is formed in the medium in order to provide it with diode characteristics.

In Example 3, a p-type InSb single-crystal wafer measuring 5 mm×8 mm in a thickness of 0.5 mm doped with $3.5 \times 10^{15}$ cm$^{-3}$ of Ge (manufactured by Wafer Technology Ltd.) was used as the InSb single crystal. The surface of the p-type InSb single-crystal wafer was etched with a 1:10 liquid mixture of nitric acid and lactic acid and a Sn layer was then deposited. The SnAl layer was subsequently etched to form a mesa electrode of 3 mmφ. In order to form a resistive electrode on the other side of the wafer, it was fixed by In soldering to a Cu substrate.

Figure 8:
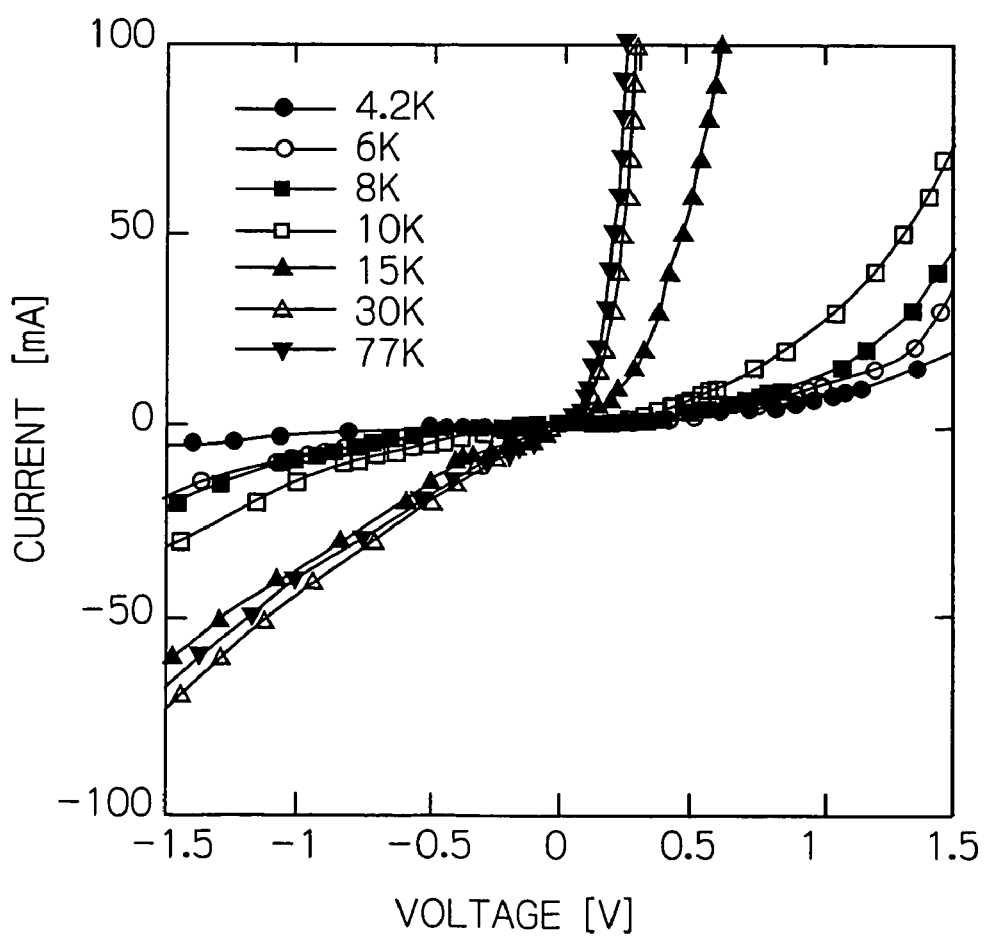
FIG. 8 is a graph showing the current-voltage characteristics of the pn-junction type solid-state radiation detector using the p-type high-purity InSb single crystal for the temperature range from 4.2 K to 77 K.

In order to confirm that the fabricated InSb semiconductor device would have diode characteristics, its current-voltage characteristics were measured over the temperature range from 4.2 K to 77 K. The results of the measurement are shown in FIG. 8. It was confirmed that adequate diode characteristics were obtained even at 77 K. Since the device's resistance was about 200 kΩ, the diode characteristics of the device at 4.2 K were improved by at least three orders of magnitude over those of the prior art device that Kanno et al. fabricated by forming a surface barrier layer on top of p-type InSb. In addition, even at 77 K, the device's resistance was 25 kΩ, indicating that the device had very good diode characteristics at elevated temperature.

Figure 9:
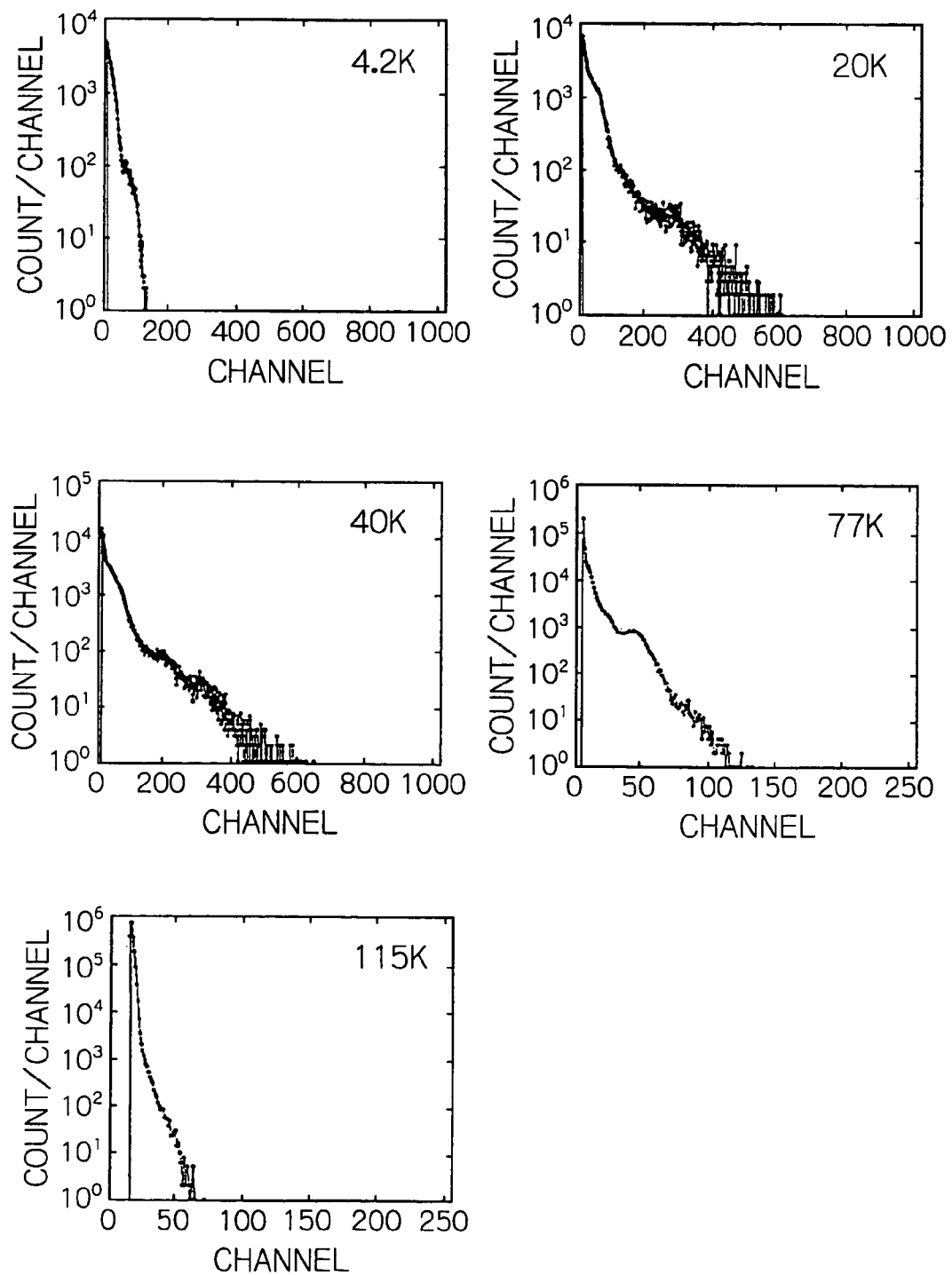
FIG. 9 is a set of graphs showing the results of measuring α-ray pulse height spectra with the pn-junction type solid-state radiation detector using the p-type high-purity InSb single crystal over the temperature range from 4.2 K to 115 K.

Subsequently, the InSb semiconductor device was mounted on a liquid He cooling vessel and operated over a temperature range from 2 K to 115 K in order to measure its pulse height spectrum characteristics for α-rays. The output signals from the charge-sensitive preamplifier were shaped and amplified with a main amplifier; thereafter, pulse height spectra were measured with a multi-channel pulse height analyzer. The results of measurements of α-ray pulse height spectra over a temperature range from 2 K to 115 K are shown in FIG. 9.

As it turned out, the p-type InSb solid-state device having the pn junction formed in it was capable of satisfactory α-ray detection over the temperature range from 4.2 K to 115 K.

EXAMPLE 4

This example concerns a method of fabricating a compound semiconductor InSb solid-state detecting device by thermally diffusing Sn to form an n-type electrode so that a pn junction is formed in the InSb semiconductor device shown in FIGS. 5 and 7.

First, the surface of an InSb single-crystal wafer was etched with a 1:10 liquid mixture of nitric acid and lactic acid. Thereafter, Sn was deposited in a thickness of several nanometers, then Al in a thickness of 100 nm.

Subsequently, the wafer was placed in vacuo and annealed by exposure to a heat source such as a lamp at a temperature between 200° C. and 300° C. In Example 3, the thickness of the Sn layer was about 100 nm.

As a consequence, a pn-junction type InSb semiconductor device could be fabricated that had the good diode characteristics depicted in FIGS. 6 and 8.

The problem of absorption by the electrode exists with particle beam or low-energy soft x-rays, so the thickness of the Sn layer needs to be adjusted to 10 nm or less by controlling the annealing temperature and time. In the case of high-energy x-rays and gamma-rays, the thickness of the Sn layer needs to be somewhat increased in order to make a satisfactory electrode.

EXAMPLE 5

This example concerns the operating conditions of an InSb solid-state detecting device having a pn junction formed in it that uses, as the radiation detecting medium described in Example 3, a p-type InSb single crystal prepared by doping an InSb single crystal with Ge. While providing the diode characteristics necessary for operation as a solid-state detector, the device can perform pulse height analysis based on the rise time characteristics for α-rays of output signals from a charge-sensitive preamplifier.

Figure 10:
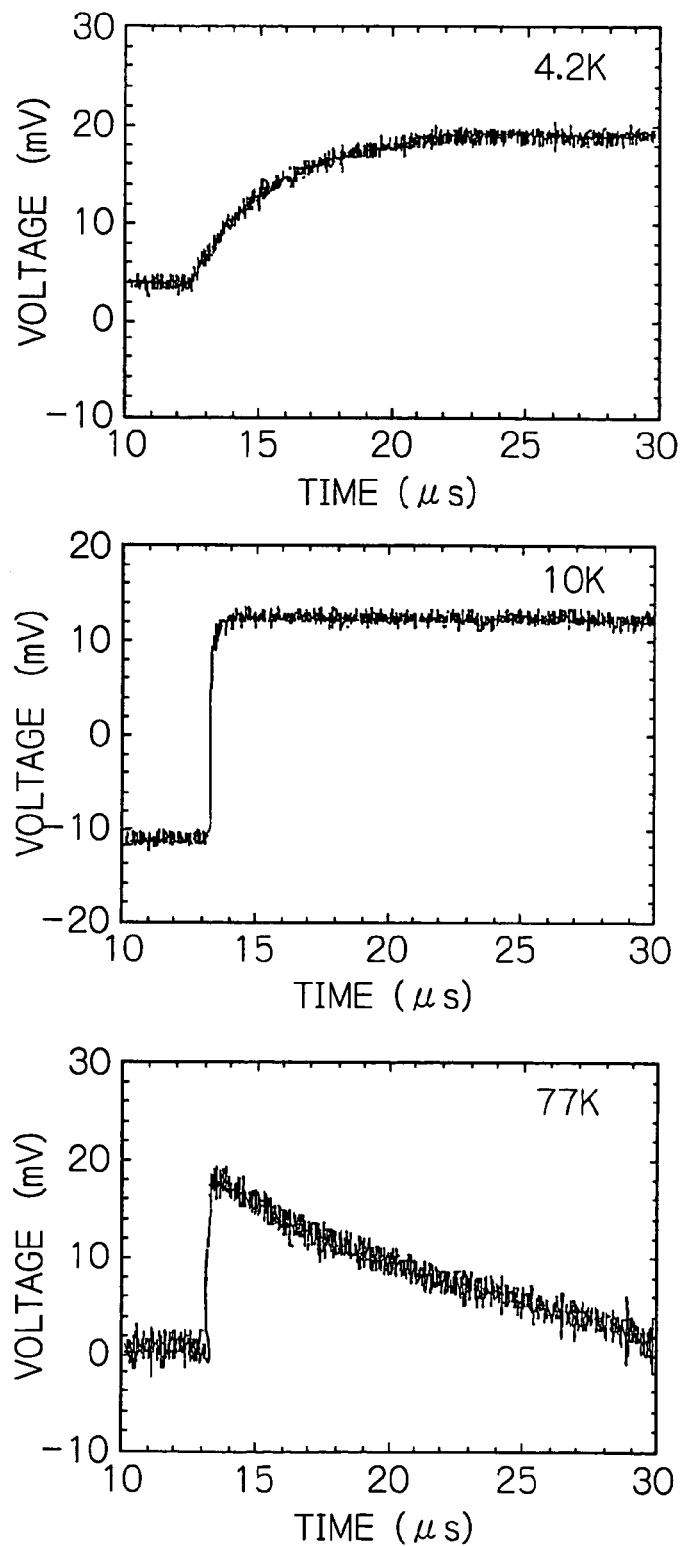
FIG. 10 is a set of graphs showing the results of measuring the rise time characteristics of the pn-junction type solid-state radiation detector using the p-type high-purity InSb single crystal at temperatures of 4.2 K, 10 K and 77 K.
Figure 11:
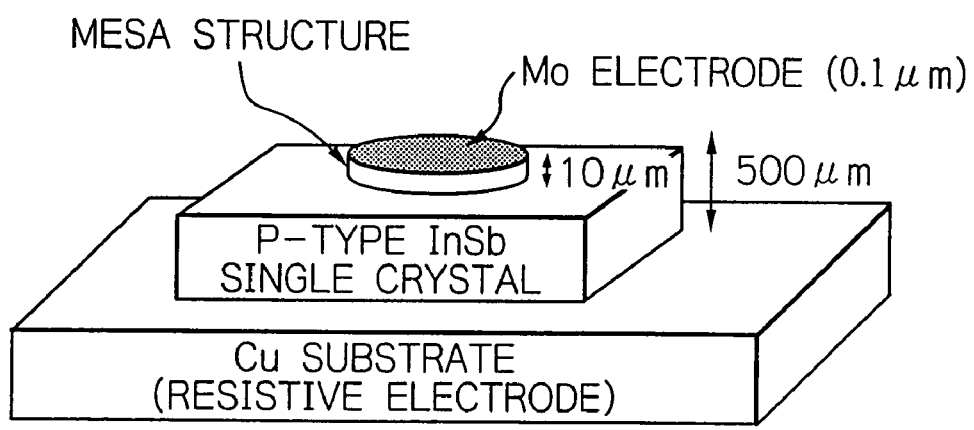
FIG. 11 is a schematic drawing of a surface-barrier type solid-state radiation detector using the conventional Ge-doped p-type InSb single crystal.

The p-type InSb solid-state detecting device having the pn junction formed in it was mounted on a liquid He cooling vessel and operated at temperatures of 4.2 K, 10 K and 115 K; the rise time characteristics for α-rays of output signals from a charge-sensitive preamplifier which is a parameter that influences the performance of semiconductor devices were measured with a digital oscilloscope. The results of measurements are shown in FIG. 10. At 4.2 K, the rise time was very long (20 µs), indicating the occurrence of considerable trapping. Even at 10 K, the rise time was still long (7 µs) and the effect of trapping was fairly great. However, when the temperature rose to 77 K, there was no trapping and the rise time became shorter than 1 µs.

Hence, on the basis of the fact that when the device is operated over the temperature range from 77 K to 115 K, the rise time of signals output from the charge-sensitive preamplifier becomes shorter than 1 µs on account of reduced trapping of electrons or positive holes, the shaping time constant of the main amplifier is set below 2 µs and the peak heights of pulses are analyzed not only to facilitate energy analysis of radiations but also to improve the energy resolution of the analysis.

In addition, the above results show that when the semiconductor device of Example 5 is operated under the temperature conditions of from 77 K to 115 K, the electrons and positive holes produced in the bulk of high-purity InSb upon incidence of radiation are not trapped significantly but are collected at the n-type and p-type electrodes, respectively. Such reduced loss is a major factor in improvement of energy resolution. Since the operability of the device at 77 K and above means that it can be cooled with liquid nitrogen, the cost of the cooling equipment can be reduced.

Since the compound semiconductor InSb having a very small band-gap energy (0.165 ev) is used as a radiation detecting element, more electron-hole pairs are produced upon incidence of a radiation and a solid-state radiation detector having high energy resolution can be fabricated.

Since In and Sb have high atomic numbers of 49 and 51, respectively, using the compound semiconductor InSb permits increased absorption of x-rays and gamma-rays and contributes to the fabrication of a smaller-scale solid-state radiation detector.

Using a detection medium made of an undoped high-purity InSb single crystal, the invention enables the fabrication of a radiation detector that traps smaller numbers of electrons or positive holes.

Using a pn-junction type InSb detecting device, the invention provides a solid-state radiation detector having good enough diode characteristics.

In the case of a Ge-doped p-type InSb detecting device, operation at elevated temperatures is possible in order to perform radiation detection without the device being greatly affected by the trapping of electrons or positive holes.

What is claimed is:

1. In a solid-state radiation detector using a single crystal that comprises the compound semiconductor InSb as the matrix, the improvement wherein the single crystal is one of high-purity InSb that is not artificially doped with impurities, a surface barrier layer being formed on top of the high-purity InSb single crystal to fabricate a semiconductor device provided with diode characteristics and which is operated at a temperature between 2 K and 50 K.

2. In a solid-state radiation detector using a single crystal that comprises the compound semiconductor InSb as the matrix, the improvement wherein the single crystal is one of high-purity InSb that is not artificially doped with impurities, a pn junction being formed in the high-purity InSb single crystal to fabricate a semiconductor device provided with diode characteristics and which is operated at a temperature between 2 K and 115 K.

3. The solid-state radiation detector according to claim 2, wherein the formation of a pn junction involves thermal diffusing of Sn to form an n-type electrode.

* * * * *